US011860214B2

(12) United States Patent
Jacques et al.

(10) Patent No.: US 11,860,214 B2
(45) Date of Patent: Jan. 2, 2024

(54) SYSTEM FOR MONITORING THE STATE OF A CABLE THROUGH DISTRIBUTED REFLECTOMETRY

(71) Applicant: COMMISSARIAT A L'ENERGIE ATOMIQUE ET AUX ENERGIES ALTERNATIVES, Paris (FR)

(72) Inventors: Marie-Bénédicte Jacques, Gif-sur-Yvette (FR); Wafa Ben Hassen, Paris (FR); Cyril Chastang, Meudon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/770,991

(22) PCT Filed: Oct. 13, 2020

(86) PCT No.: PCT/EP2020/078666
§ 371 (c)(1),
(2) Date: Apr. 21, 2022

(87) PCT Pub. No.: WO2021/083656
PCT Pub. Date: May 6, 2021

(65) Prior Publication Data
US 2022/0365126 A1 Nov. 17, 2022

(30) Foreign Application Priority Data
Oct. 29, 2019 (FR) ...................................... 1912139

(51) Int. Cl.
*G01R 31/11* (2006.01)
*G01R 31/08* (2020.01)

(52) U.S. Cl.
CPC ............ *G01R 31/11* (2013.01); *G01R 31/085* (2013.01)

(58) Field of Classification Search
CPC ...... G01R 31/11; G01R 31/085; G01R 31/08; H02H 1/003; H02H 5/10; H02H 7/265
See application file for complete search history.

(56) References Cited

U.S. PATENT DOCUMENTS 6,195,614 B1 * 2/2001 Kochan ................. G01R 13/02
702/66
2010/0315092 A1 12/2010 Nacson et al.
(Continued)

*Primary Examiner* — Feba Pothen
(74) *Attorney, Agent, or Firm* — BakerHostetler

(57) ABSTRACT

A system for monitoring the state of a cable, includes a plurality of reflectometry devices able to inject a test signal at a point of injection into the cable and to measure a signal having propagated back through the cable to the point of injection into the cable, the reflectometry devices being intended to be positioned along the cable so as to divide the cable into successive segments, the system comprising a control unit that is able to communicate with the reflectometry devices and that is configured so as to carry out at least one reflectometry test consisting in injecting a test signal into the cable by means of a first reflectometry device and measuring the test signal, by means of the first reflectometry device, after it has propagated through the cable and been reflected from an impedance discontinuity, the system further comprising a post-processing unit able to communicate with the reflectometry devices and configured to analyze the measurement of the test signal with a view to detecting an amplitude peak corresponding to a fault.

11 Claims, 2 Drawing Sheets

(56) References Cited

U.S. PATENT DOCUMENTS

2014/0222356 A1 8/2014 Incarbone
2018/0143239 A1* 5/2018 Sallem ................ G01R 31/088

* cited by examiner

SYSTEM FOR MONITORING THE STATE OF A CABLE THROUGH DISTRIBUTED REFLECTOMETRY

CROSS-REFERENCE TO RELATED APPLICATIONS

This application is a National Stage of International patent application PCT/EP2020/078666, filed on Oct. 13, 2020, which claims priority to foreign French patent application No. FR 1912139, filed on Oct. 29, 2019, the disclosures of which are incorporated by reference in their entirety.

FIELD OF THE INVENTION

The invention relates to the field of monitoring the state of long cables, for example submarine cables, power cables or communication cables. More generally, the invention is applicable to any cable that greatly attenuates a signal propagating from one end of the cable to the other.

BACKGROUND

One general objective of the invention is to provide a solution allowing the state of degradation of a very long cable to be evaluated, and in particular electrical faults that may appear when the cable is degraded to be detected.

Among known solutions allowing the state of health of a cable to be diagnosed, methods based on reflectometry allow the appearance of faults in cables or networks of cables to be detected. These methods are based on injection of a test signal into the cable to be analyzed. The signal is reflected from the impedance discontinuity caused by the fault, then propagates back to the point of injection where it is measured. Analysis of the reflected signal allows an electrical signature corresponding to the fault to be detected. The electrical signature may, for example, take the form of an amplitude peak. Certain reflectometry methods also allow the defect to be located.

There are various reflectometry methods, which methods are based on analyses in the time or frequency domain and employ test signals of various natures (pulsed signals, multi-carrier signals or more complex signals).

One drawback of known reflectometry methods is that, because of attenuation and dispersion of the signal, which becomes excessive beyond a certain distance, they are unsuitable for very long cables.

There is therefore a need for a system for analyzing the state of degradation of a very long cable.

SUMMARY OF THE INVENTION

The invention provides a solution that allows faults to be detected in a very long cable by means of a monitoring system composed of a plurality of sensors placed along the cable and connected to one another and to a control unit by means of a communication link. The control unit controls the various sensors in order to carry out tests on each segment of the cable using a reflectometry-based analyzing method.

The invention solves the problems of signal attenuation by means of a multi-sensor system that allows tests to be carried out per cable segment. Thus, the distance travelled by the signal injected into the cable and then measured is decreased.

One subject of the invention is a system for monitoring the state of a cable, the system comprising a plurality of reflectometry devices each being able to inject a test signal at a point of injection into the cable and to measure a signal having propagated back through the cable to the point of injection into the cable, the reflectometry devices being intended to be positioned along the cable at predetermined positions so as to divide the cable into successive segments, the system comprising a control unit that is able to communicate with the reflectometry devices and that is configured so as to carry out at least one reflectometry test consisting in injecting a test signal into the cable by means of a first reflectometry device and measuring the test signal, by means of the first reflectometry device, after it has propagated through the cable and been reflected from an impedance discontinuity, the system further comprising a post-processing unit able to communicate with the reflectometry devices and configured to analyze the measurement of the test signal with a view to detecting an amplitude peak corresponding to a fault.

According to one particular aspect of the invention, the post-processing unit is configured to evaluate, on the basis of the measurement of the test signal, the distance between the impedance discontinuity and the point of injection of the signal into the cable and to conclude that a fault is present if the distance is smaller than the distance between two neighboring reflectometry devices.

According to one particular aspect of the invention, the control unit is configured to command, according to a predefined test procedure, each reflectometry device so as to activate or deactivate the injection of a test signal into the cable by means of said device and to activate or deactivate the acquisition of a measurement of a signal propagating through the cable by means of said device.

According to one particular aspect of the invention, the test procedure consists in successively executing the following commands:

activating the injection of a test signal by a first reflectometry device located at the start of a first segment of the cable, activating the acquisition of a signal measurement by the first reflectometry device, after a predetermined monitoring first duration, deactivating the injection of a test signal by the first device and deactivating the acquisition of a measurement by the first device, after a predetermined delay second duration, reiterating the preceding steps for the following cable segments.

According to one particular aspect of the invention, the monitoring first duration is predetermined depending on the speed of propagation of the signal through the cable and on the distance between two consecutive reflectometry devices.

According to one particular aspect of the invention, the delay second duration is predetermined depending on the speed of propagation of the signal through the cable and on an attenuation coefficient of the signal.

According to one particular aspect of the invention, the control unit is configured to simultaneously activate a plurality of reflectometry tests for a plurality of segments of the cable, said segments being spaced apart from each other by a predetermined distance that depends on the propagation speed of the signal through the cable and on the attenuation coefficient of the signal.

According to one particular aspect of the invention, the control unit is configured to simultaneously activate a plurality of reflectometry tests for a plurality of segments of the cable by means of test signals that are mutually orthogonal.

According to one particular aspect of the invention, each reflectometry device comprises means for coupling to the cable, with a view to injecting and measuring a signal at a point on the cable.

According to one particular aspect of the invention, the coupling means is an inductive or capacitive contactless coupler.

According to one particular aspect of the invention, the coupling means is made up of a plurality of toroids placed in parallel in the vicinity of a point on the cable, each toroid being connected to the reflectometry device by a connecting wire forming a plurality of windings around the toroid.

According to one particular aspect of the invention, the coupling means is achieved via physical contact with the cable.

Another subject of the invention is an assembly comprising a cable and a system for monitoring the state of the cable according to the invention.

BRIEF DESCRIPTION OF THE DRAWINGS

Other features and advantages of the present invention will become more clearly apparent on reading the following description with reference to the following appended drawings.

DETAILED DESCRIPTION

Figure 1:
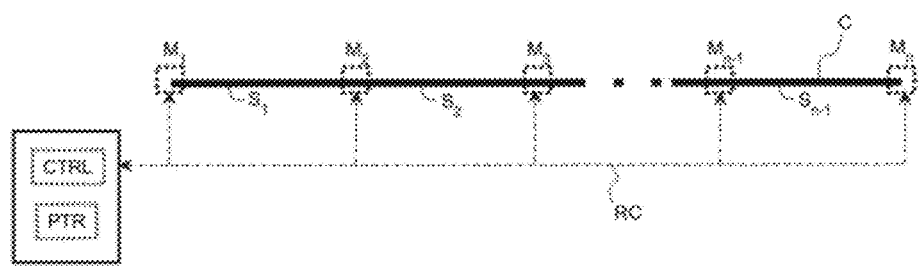
FIG. 1 shows a diagram of a system for monitoring the state of a long cable according to one embodiment of the invention.

FIG. 1 shows a diagram of a system for monitoring the state of a cable C according to one embodiment of the invention. The system comprises a plurality of reflectometry sensors or devices $M_1, M_2, M_3, \ldots M_{n-1}, M_n$ placed along the cable C at chosen points that thus bound cable segments $S_1, S_2, \ldots S_{n-1}$.

Each reflectometry device is configured to perform two separate functions: a first function injecting a test signal into the cable C and a second function measuring a signal propagating through the cable C.

To this end, each reflectometry device comprises means for generating a test signal, for example a signal generator or a memory in which a digital signal is stored. The signal may be analog or digital. In the case where the signal is digital, the device also comprises a digital-analog converter. Each device also comprises a coupler for injecting the test signal into the cable C. Advantageously, the coupler also has the function of capturing a signal propagating through the cable. The coupler may be achieved via physical contact or via capacitive or inductive contactless coupling.

The captured signal is optionally digitized via an analog-to-digital converter then transmitted, via a communication network RC, to a post-processing unit PTR that is responsible for analyzing the signal.

The type of test signal used may be a pulsed signal, for example a square-wave or a Gaussian pulse, or a more complex signal, for example a multi-carrier OMTDR signal (OMTDR being the acronym of orthogonal multi-tone time-domain reflectometry). The type of signal, the power of the signal injected into the cable, its frequency and its sampling frequency may be parameterized depending on the nature of the cable to be monitored, and especially on the attenuation characteristics of the cable. These parameters also depend on the nature of the coupler used and on the precision desired for the measurement of the signal.

The distance between two devices $M_1, M_2$ especially depends on the attenuation and dispersion of the cable, and on the level of precision desired for the measurements. The distance between two devices $M_1, M_2$ is especially chosen so as to limit to a threshold value the level of attenuation of the signal when it makes the trip between two neighboring devices $M_1, M_2$. The threshold value is chosen, for example, so as to respect a minimum signal-to-noise ratio computed beforehand to respect a chosen link budget. Thus, positioning a plurality of devices along the cable C allows each cable segment to be monitored in a manner independent of the effect of signal attenuation.

The communication network RC may be achieved by any means allowing the signal measured by each device $M_1, M_2, M_3, \ldots M_{n-1}, M_n$ to be transmitted to a remote post-processing unit PTR. For example, the communication network RC is a wired network, based on optical fiber or another type of communication cable, or even a wireless network. In the case of a wireless network, each device $M_1, M_2, M_3, \ldots M_{n-1}, M_n$ is equipped with a transmitter able to transmit data to the post-processing unit PTR and with a receiver able to receive control information transmitted by a control unit CTRL.

The function of the control unit CTRL is to implement a test procedure by controlling the various devices placed along the cable. In particular, the control unit CTRL transmits commands to each device so as to activate or deactivate injection of a test signal into the cable and measurement of this signal after it has propagated back through the cable to the point of injection (which is also a measurement point).

The control unit CTRL is responsible for managing the sequence of activation of the various devices depending on the propagation time of the signal.

With reference to FIG. 1, an example of a test procedure employed to successively monitor the state of the segment $S_1$ then the state of the segment $S_2$ of cable C will now be described. Initially, all devices are deactivated, i.e. the signal-injection function and the signal-measurement function are deactivated.

Generally, the test procedure consists in implementing the following successive steps:

monitoring a first segment $S_1$ for a monitoring first duration, then waiting a delay second duration, then monitoring a second segment $S_2$ for the same monitoring first duration.

These steps are iterated for all the segments or a set of chosen segments.

Without loss of generality, the various segments $S_1, S_2, S_{n-1}$ may be of the same length or of different lengths. In the second case, the duration for which each segment is monitored may be adapted to the respective lengths of the segments and therefore be different. To simplify the implementation of the system, a common monitoring duration may be chosen by selecting the longest monitoring duration, i.e. the one corresponding to the segment of largest length.

To monitor the first segment $S_1$, the control unit CTRL transmits, to the first device $M_1$, an activation command. The activation command transmitted to the device activates the injection of a test signal and activates the acquisition of a measurement signal.

There are two possible scenarios. If the cable segment $S_1$ is fault-free, the signal is either reflected from the impedance discontinuity caused by the coupling between the second device $M_2$ and the cable, or transmitted without reflection beyond $M_2$. If, on the contrary, the cable segment $S_1$ is degraded by a fault, the signal is entirely or partially reflected from the fault.

The measured signal is transmitted by the device $M_1$ to the post-processing unit PTR. The signal injected by the device $M_1$ may continue to propagate beyond the device $M_2$ to the device $M_3$.

The monitoring first duration is determined depending on the duration of the measurement that it is desired to carry out to analyze the state of a segment.

When the monitoring first duration has elapsed, the control unit CTRL transmits, to the first device $M_1$, a deactivation command.

The delay second duration is determined depending on the speed of propagation of the signal through the cable, on the length of a cable segment and on an attenuation coefficient of the signal in the cable. It is especially computed so as to take into account the time that the signal injected by the first device $M_1$ will require to travel beyond the second device $M_2$. Moreover, it is recommendable to also take into account potential multiple reflections of this signal from impedance discontinuities. Thus, to compute the delay second duration, a worst-case situation is considered. A worst case is, for example, obtained by considering reflections of the signal occurring just after and just before the second device $M_2$. By considering the average power of the signal and its attenuation coefficient (which depends on the physical characteristics of the cable), the attenuation of the signal over time and on each of the multiple reflections may be computed. When the attenuated signal has a power (or an amplitude) lower than a predetermined threshold, its influence may be considered to be negligible. The delay second duration may therefore be set equal to the cumulative duration of the multiple trips that the signal is expected to make before its power or amplitude drops below a predetermined threshold.

More generally, the delay second duration may be defined so as to allow a sufficient margin to prevent interference between the signals transmitted by two neighboring devices.

When the delay second duration has elapsed, the control unit CTRL activates monitoring of the second segment $S_2$. To do this, it transmits, to the second device Mz, an activation command, with a view to reiterating the reflectometry analysis for the next cable segment $S_2$.

More generally, the control unit CTRL allows for potential interference between signals injected by various devices so as to prevent it.

The various reflectometry devices do not need to be precisely synchronized with each other.

The test procedure implemented by the control unit CTRL may take various forms. It may consist in successively testing the state of each cable segment $S_1, S_2 \ldots S_{n-1}$ when the targeted objective is to monitor the entire cable. Alternatively, it may also consist in independently testing a cable segment, for example with a view to monitoring the progress of a previously detected degradation.

In one variant embodiment of the invention, the control unit CTRL activates monitoring of two or more cable segments simultaneously, when the distance between the two simultaneously monitored segments is large enough that the signal will not be able to propagate this distance without being sufficiently attenuated. In other words, the attenuation coefficient of the signal is taken into account to determine a minimum distance between two devices such that simultaneous activation of these two devices will not generate interference.

In yet another variant embodiment of the invention, mutually orthogonal signals are used, for example signals coded by means of a CDMA code (CDMA standing for code-division multiple access). In this case, each device uses a different signal, that is orthogonal to all the others. Thus, it is possible to simultaneously monitor all segments at the same time. In this variant embodiment, the control unit CTRL no longer manages the sequence of the measurements but the distribution of the orthogonal signals between the various devices of the system.

The measurements taken are transmitted to a post-processing unit PTR, which performs a reflectometry test with a view to detecting a fault in a cable segment.

A reflectometry test consists in identifying, in the obtained measurement of the signal, an amplitude peak characteristic of an impedance discontinuity from which the incident signal has been reflected.

Figure 2:
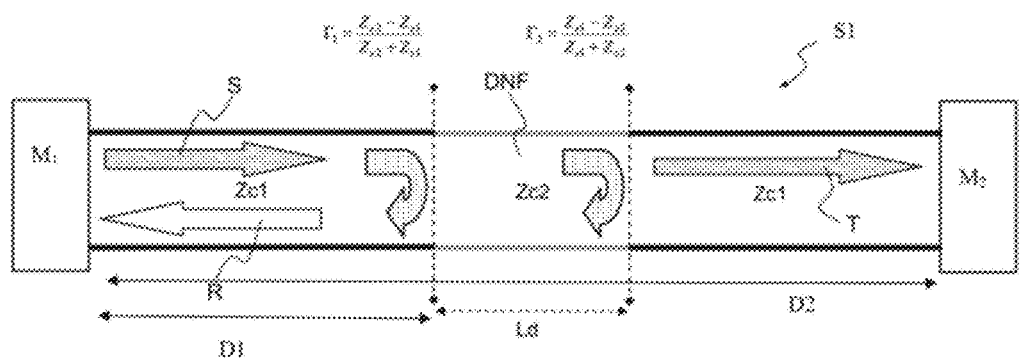
FIG. 2 shows an illustration of a reflectometry test on a cable segment.

FIG. 2 schematically shows the operating principle of a reflectometry-based diagnostic method applied to a cable segment S1 containing a fault DNF, a soft fault for example. The example described below corresponds to a time-domain reflectometry method.

A reference signal S, also called the incident signal, is injected into the cable by the device $M_1$. This signal propagates through the line and encounters, during its propagation, a first impedance discontinuity at the start of the fault DNF. The signal is reflected from this discontinuity with a reflection coefficient $\Gamma_1$. If the characteristic impedance $Z_{c2}$ in the region of the soft fault DNF is less than the characteristic impedance $Z_{c1}$ before the occurrence of the fault, then the reflection coefficient $\Gamma_1$ is negative and results in a peak of negative amplitude in the reflected signal R. In the opposite case, the reflection coefficient $\Gamma_1$ is positive and results in a peak of positive amplitude in the reflected signal R.

The transmitted portion T of the incident signal S continues to propagate through the line and then encounters a second impedance discontinuity, creating a second reflection of the incident signal with a reflection coefficient $F_2$ of a sign opposite to the first reflection coefficient $\Gamma_1$. If $\Gamma_1 0$, then $\Gamma_2 > 0$. If $\Gamma_1 > 0$ then $\Gamma_2 < 0$.

The reflected signal R is measured by the device $M_1$. By observing the reflected signal R, the signature of the soft fault DNF is characterized by two successive peaks of opposite signs, as shown in FIG. 3.

Figure 3:
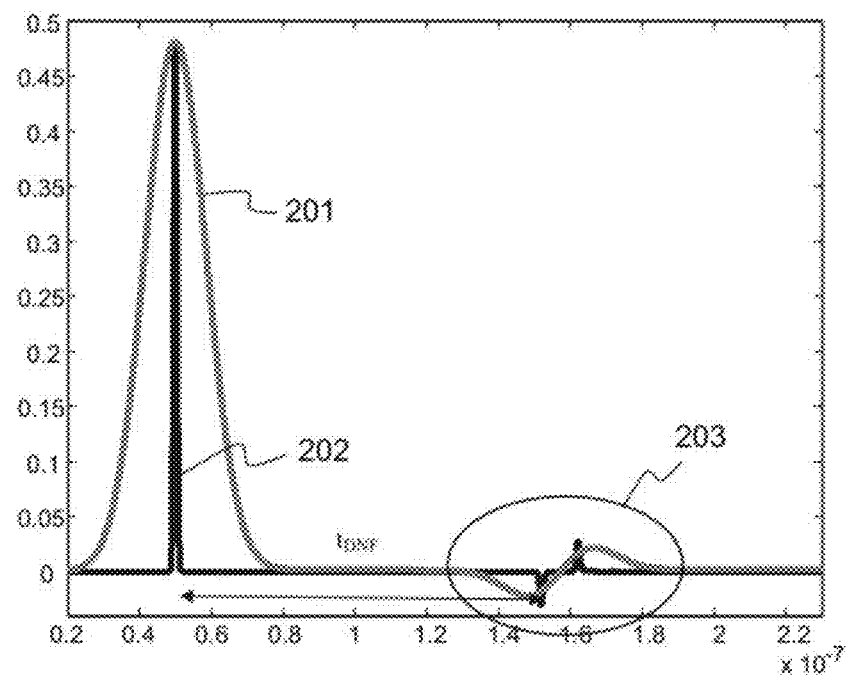
FIG. 3 shows a plot as a function of time illustrating a reflectometry test applied to a measurement of a reflected signal.

FIG. 3 shows a time-domain reflectogram that corresponds either directly to the measurement of the reflected signal R or to the intercorrelation between the reflected signal R and the signal injected into the cable S.

In the case where the injected reference signal is a time-dependent pulse, this corresponding to the case of a time-domain reflectometry method, the reflectogram may correspond directly to the measurement of the reflected signal R. In the case where the injected reference signal is a more complex signal, for example for MCTDR (multi-carrier time-domain reflectometry) or OMTDR (orthogonal multi-tone time-domain reflectometry) methods, then the reflectogram is obtained by intercorrelating the reflected signal R and the injected signal S.

FIG. 3 shows two reflectograms 201,202 corresponding, as regards the signal injected into the cable, to two different pulse durations. Curve 201 corresponds to a pulse duration 2. $\Delta T$ much longer than the time taken by the signal to pass through the soft fault DNF. With the length of the fault being denoted Ld, this duration is equal to Ld/V, where V is the propagation speed of the signal through the cable. The curve 202 corresponds to a pulse duration 2.ΔT much shorter than the time taken by the signal to pass through the soft fault DNF.

In both cases, the signature 203 of the soft fault, in the reflectogram, is the succession of a first peak and second peak the signs of which are opposite.

The distance between the two peaks characterizes the length of the soft fault, and their amplitude characterizes the severity of the soft fault. Specifically, the larger the variation in the characteristic impedance, the higher the amplitude of the signature of the soft fault in the reflectogram.

As is known in the field of reflectometry-based diagnostic methods, the position $d_{DNF}$ of the soft fault in the cable, or in other words its distance from the point P of injection of the signal, may be obtained by directly measuring, in the time-domain reflectogram of FIG. 3, the duration $t_{DNF}$ between the first amplitude peak recorded in the reflectogram (at the x-coordinate 0.5 in the example of FIG. 3) and the amplitude peak 203 corresponding to the signature of the soft fault.

Various known methods may be contemplated for determining the position $d_{DNF}$. A first method consists in applying the relationship linking distance and time: $d_{DNF}=V.t_{DNF}$, where V is the speed of propagation of the signal through the cable.

In the case where a reflection of the signal occurs at the device located at the end of a cable segment, another possible method consists in applying a proportionality relationship such as $d_{DNF}/t_{DNF}=l/t_0$ where l is the length of the cable segment and $t_0$ is the duration, measured in the reflectogram, between the amplitude peak corresponding to the impedance discontinuity at the point of injection and the amplitude peak corresponding to the reflection of the signal from the end of the segment.

In the case where the cable segment $S_1$ is healthy, i.e. fault-free, the signal R is either reflected from the impedance discontinuity caused by the coupling between the second device $M_2$ and cable C, or it is not reflected. These two situations may be identified by analyzing the presence or absence of amplitude peaks in the measured reflectogram and the time coordinates of any peaks. For example, if a reflection occurs at a distance larger than the length of a cable segment, this means that there is no fault in the analyzed segment.

One advantage of the invention is the ability to provide information on the location of the degradation or fault, located in a particular cable segment. Analysis of the reflectogram moreover allows the fault to be located inside the identified cable segment.

Figure 4:
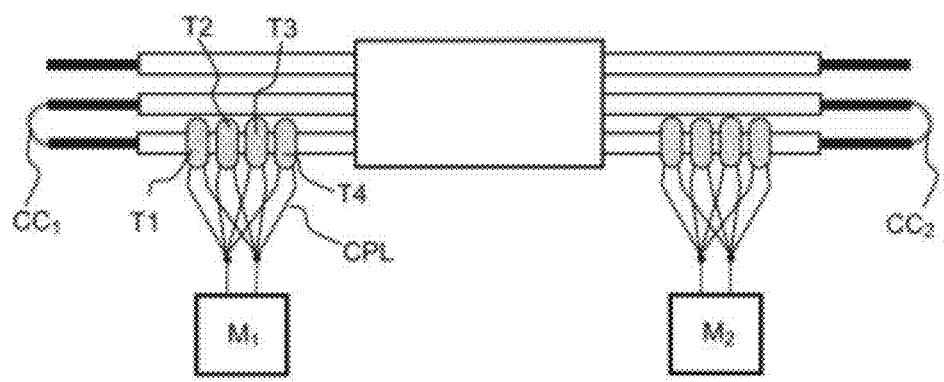
FIG. 4 represents a diagram of an example of implementation of the system according to the invention.

FIG. 4 shows, diagrammatically, one example of embodiment of a reflectometry device $M_1, M_2$ used to monitor the state of a conductor of a three-phase cable comprising three conductors. The ends of the cable under test are short-circuited $CC_1$, $CC_2$ with an adjacent conductor allowing current to flow between these two conductors.

This loop may be formed in various ways. A first embodiment example consists in connecting the core of a coaxial cable to its shielding via a resistor at each of the ends of the cable. A second example of embodiment consists in connecting two independent conductors via short circuits $CC_1$, $CC_2$ as illustrated in FIG. 4.

In the example illustrated in FIG. 4, the coupling between each device $M_1, M_2$ and the cable is achieved via a contactless inductive coupler CPL. The inductive couplers are, for example, made up of ferrite toroids $T_1, T_2, T_3, T_4$ that are mounted in parallel in the vicinity of a point on the cable. In the example of FIG. 4, the coupler consists of four toroids. Each toroid comprises a plurality of windings of the connecting wire that connects it to the device. The number of toroids and the number of windings is a parameter that allows the gain of the coupling and its constancy as a function of frequency to be controlled, so as to better control the amplification of the signal injected or measured.

The example of FIG. 4 may be generalized to the monitoring of all three conductors of the cable, one coupler CPL being positioned on each conductor, or to a single cable with a single connector.

Without departing from the scope of the invention, the cable and each device may be coupled by other contactless coupling means or via a physical connection to the cable. For example, galvanic coupling may be achieved by stripping the cable and placing it in contact with a metal clamp connected to the device $M_1, M_2$.

Each reflectometry device may be implemented by means of an on-board processor. The processor may be a generic processor, a specific processor, an application-specific integrated circuit (ASIC) or a field-programmable gate array (FPGA). The device according to the invention may use one or more dedicated electronic circuits or a general-purpose circuit. The technique of the invention may be carried out on a reprogrammable computing machine (a processor or a microcontroller for example) executing a program comprising a sequence of instructions, or on a dedicated computing machine (for example a set of logic gates such as an FPGA or an ASIC, or any other hardware module).

The control unit CTRL and the post-processing unit PTR may be implemented by means of a computer or any other equivalent computing device.

The invention claimed is:

1. A system for monitoring the state of a cable, the system comprising a plurality of reflectometry devices each being able to inject a test signal at a point of injection into the cable and to measure a signal having propagated back through the cable to the point of injection into the cable, the reflectometry devices being intended to be positioned along the cable at predetermined positions so as to divide the cable into successive segments, the system comprising a control unit able to communicate with the reflectometry devices and configured to carry out at least one reflectometry test which includes injecting a test signal into the cable with a first reflectometry device and measuring the test signal, with the first reflectometry device, after the test signal has propagated through the cable and been reflected from an impedance discontinuity, the system further comprising a post-processing unit able to communicate with the reflectometry devices and configured to analyze a measurement of the test signal with a view to detecting an amplitude peak corresponding to a fault, the control unit being configured to command, according to a predefined test procedure, each reflectometry device so as to activate or deactivate an injection of a test signal into the cable with each said reflectometry device and to activate or deactivate the acquisition of a measurement of a signal propagating through the cable with each said reflectometry device, the test procedure consisting in successively executing the following commands:

activating the injection of a test signal by a first reflectometry device located at the start of a first segment of the cable, activating the acquisition of a signal measurement by the first reflectometry device, after a predetermined monitoring first duration, deactivating the injection of a test signal by the first device and deactivating the acquisition of a measurement by the first device, after a predetermined delay second duration, reiterating the preceding steps for the following segments of the cable.

2. The system for monitoring the state of a cable as claimed in claim 1, wherein the post-processing unit is configured to evaluate, on the basis of the measurement of the test signal, a distance between the impedance discontinuity and the point of injection of the signal into the cable and to conclude that a fault is present if the distance is smaller than a distance between two neighboring reflectometry devices.

3. The system for monitoring the state of a cable as claimed in claim 1, wherein the monitoring of the first duration is predetermined depending on a speed of propagation of the signal through the cable and on a distance between two consecutive reflectometry devices.

4. The system for monitoring the state of a cable as claimed in claim 3, wherein the delay second duration is predetermined depending on the speed of propagation of the signal through the cable and on an attenuation coefficient of the signal.

5. The system for monitoring the state of a cable as claimed in claim 1, wherein the control unit is configured to simultaneously activate a plurality of reflectometry tests for a plurality of segments of the cable, said segments being spaced apart from each other by a predetermined distance that depends on a propagation speed of the signal through the cable and on the attenuation coefficient of the signal.

6. The system for monitoring the state of a cable as claimed in claim 1, wherein the control unit is configured to simultaneously activate a plurality of reflectometry tests for a plurality of segments of the cable with test signals that are mutually orthogonal.

7. The system for monitoring the state of a cable as claimed in claim 1, wherein each reflectometry device comprises a coupler for coupling to the cable, with a view to injecting and measuring a signal at a point on the cable.

8. The system for monitoring the state of a cable as claimed in claim 7, wherein the coupler is an inductive or capacitive contactless coupler.

9. The system for monitoring the state of a cable as claimed in claim 7, wherein the coupling means is made up of a plurality of toroids placed in parallel in the vicinity of a point on the cable, each toroid being connected to the reflectometry device by a connecting wire forming a plurality of windings around the toroid.

10. The system for monitoring the state of a cable as claimed in claim 7, wherein the coupling by the coupler is achieved via physical contact with the cable.

11. An assembly comprising a cable and a system for monitoring the state of the cable as claimed in claim 1.

* * * * *